(12) United States Patent
Doi

(10) Patent No.: US 7,659,760 B2
(45) Date of Patent: Feb. 9, 2010

(54) PLL CIRCUIT AND SEMICONDUCTOR INTEGRATED DEVICE

(75) Inventor: Yoshiyasu Doi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/182,787

(22) Filed: Jul. 30, 2008

(65) Prior Publication Data
US 2009/0009223 A1 Jan. 8, 2009

Related U.S. Application Data

(63) Continuation of application No. PCT/JP2006/301588, filed on Jan. 31, 2006.

(51) Int. Cl.
*H03L 7/06* (2006.01)
(52) U.S. Cl. .................. 327/157; 327/158; 327/147
(58) Field of Classification Search .......... 327/147, 327/157, 158, 536, 537
See application file for complete search history.

(56) References Cited

U.S. PATENT DOCUMENTS

| 7,078,946 B2* | 7/2006 | van der Valk et al. ....... 327/156 |
| 7,236,425 B2* | 6/2007 | Sudou ................... 365/233.14 |
| 7,382,634 B2* | 6/2008 | Buchmann ................ 363/59 |
| 7,382,635 B2* | 6/2008 | Noda ..................... 363/60 |
| 2008/0111598 A1* | 5/2008 | Yanagigawa et al. ........ 327/157 |
| 2008/0231347 A1* | 9/2008 | Yen et al. ................ 327/536 |
| 2009/0058536 A1* | 3/2009 | Gomez .................... 331/17 |
| 2009/0174466 A1* | 7/2009 | Hsieh et al. .............. 327/536 |
| 2009/0219078 A1* | 9/2009 | Chu et al. ................ 327/536 |

FOREIGN PATENT DOCUMENTS

| JP | 63-072936 U | 5/1988 |
| JP | 6-41392 Y2 | 10/1994 |
| JP | 2914310 B2 | 4/1999 |
| JP | 2001-069001 A | 3/2001 |

* cited by examiner

*Primary Examiner*—Lincoln Donovan
*Assistant Examiner*—Adam D Houston
(74) *Attorney, Agent, or Firm*—Arent Fox LLP

(57) ABSTRACT

A charge pump circuit comprises two MOS transistors serially connected between a power supply voltage VDD and ground, a switch SW0, four switches SW1 through SW4, four capacitors C1 through C4, and four switches SW5 through SW8. If a control voltage Vcntl is to be varied, a specific switch SW of the switches SW1 through SW4 is turned on such that a specific capacitor is charged to the power supply voltage VDD. Then, a specific switch SW of the switches SW5 through SW8 is turned on to transfer the electric charge stored in the capacitor to the capacitor of a low-pass filter and thereby the control voltage is controlled at a desired value.

15 Claims, 20 Drawing Sheets

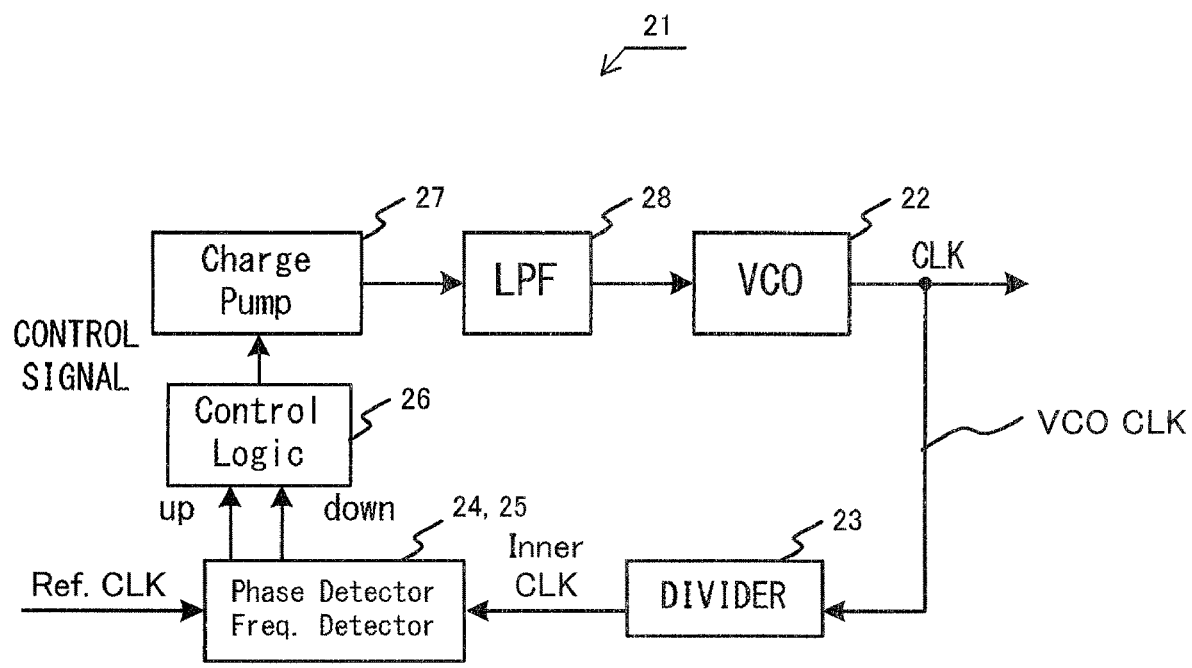
F I G. 1

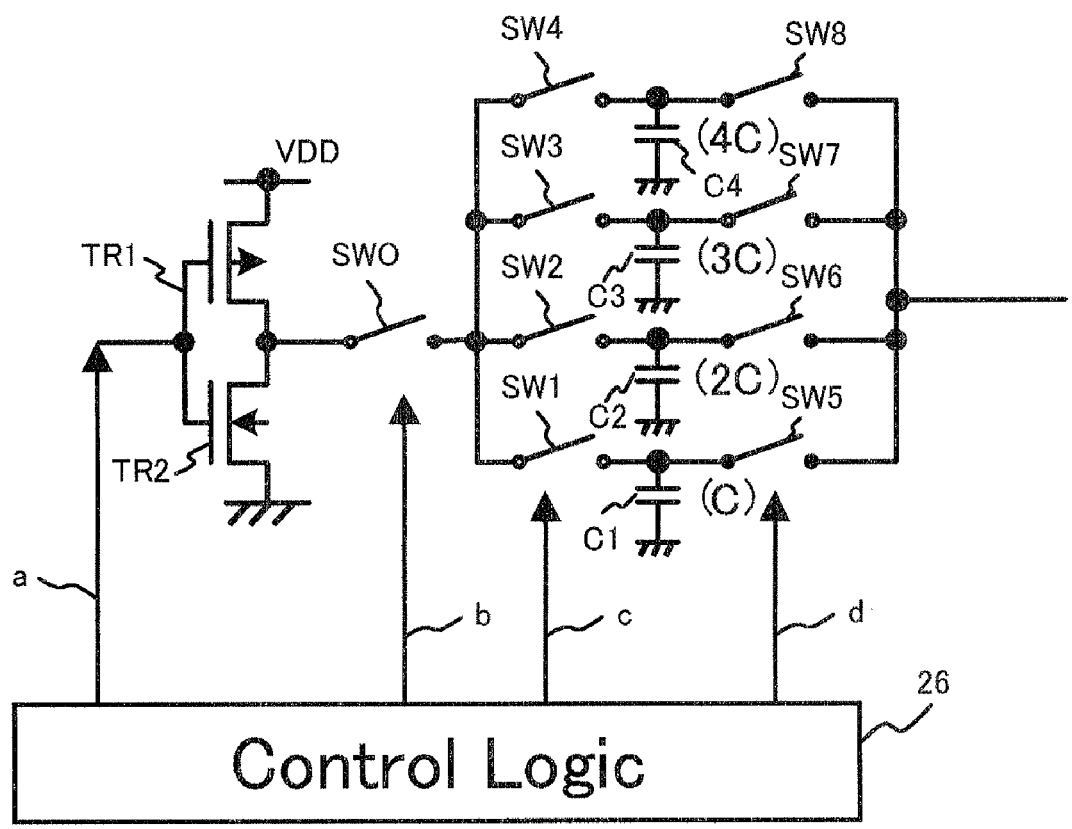
F I G. 2

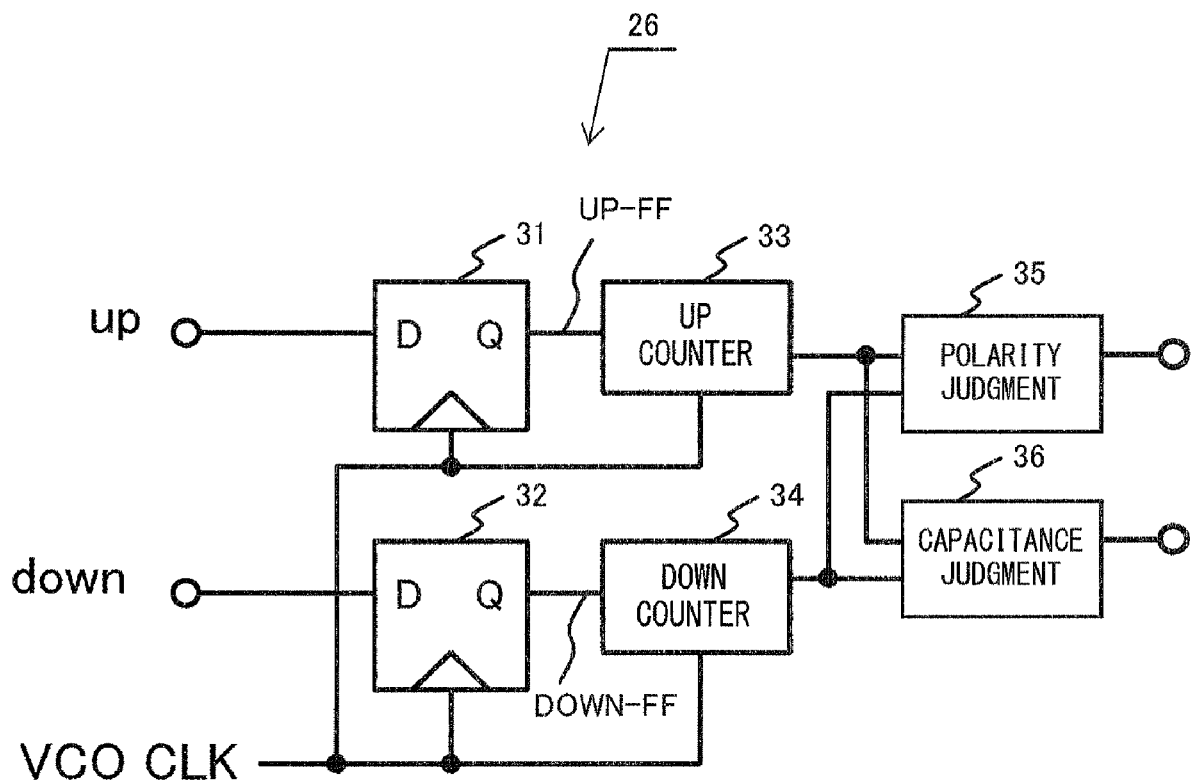
F I G. 4

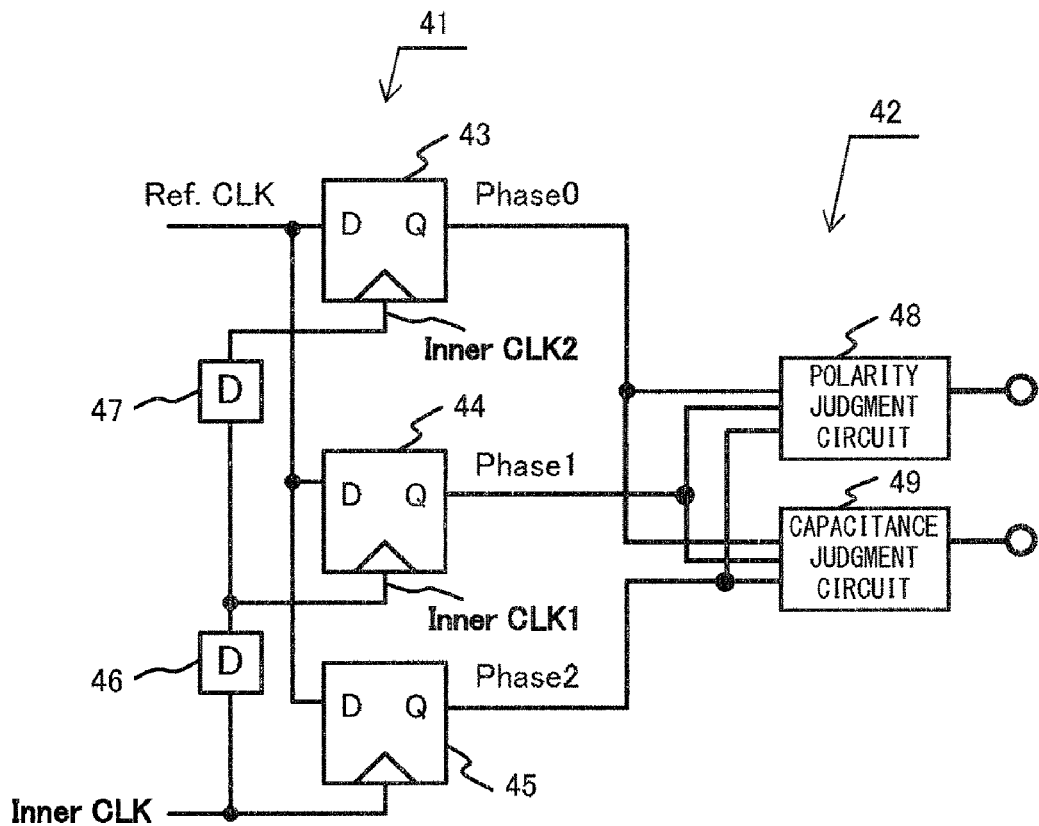
F I G. 9

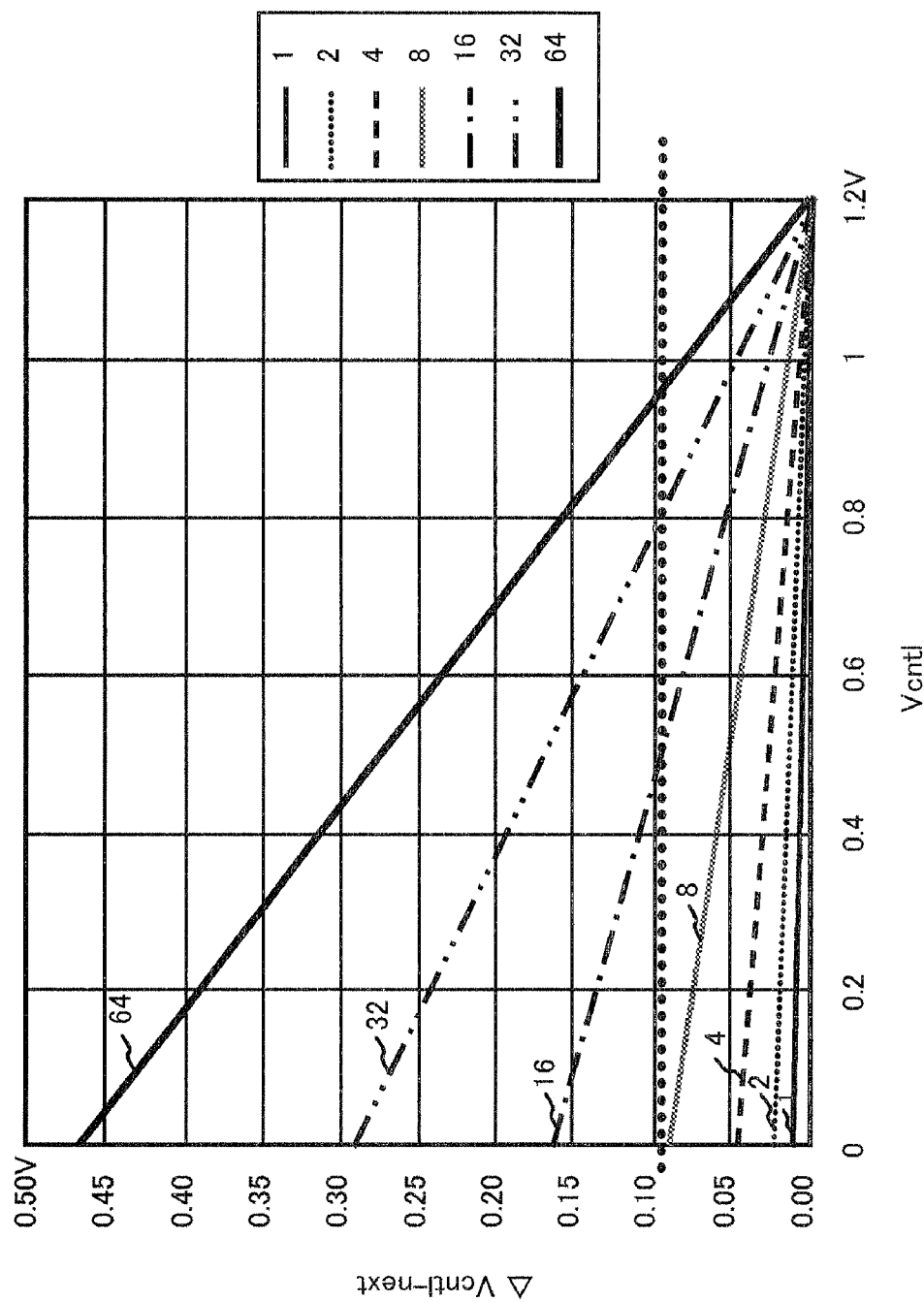
F I G. 11

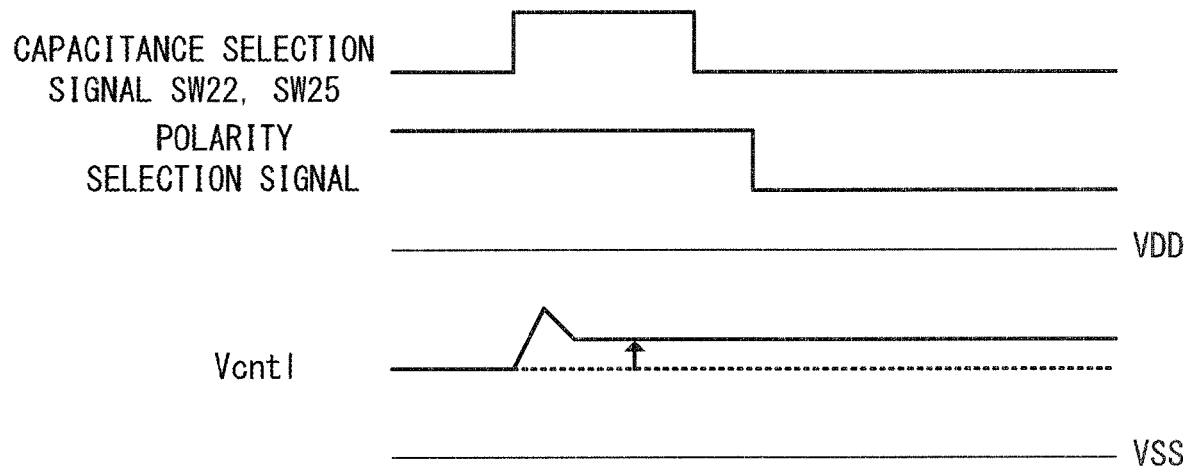
F I G. 18

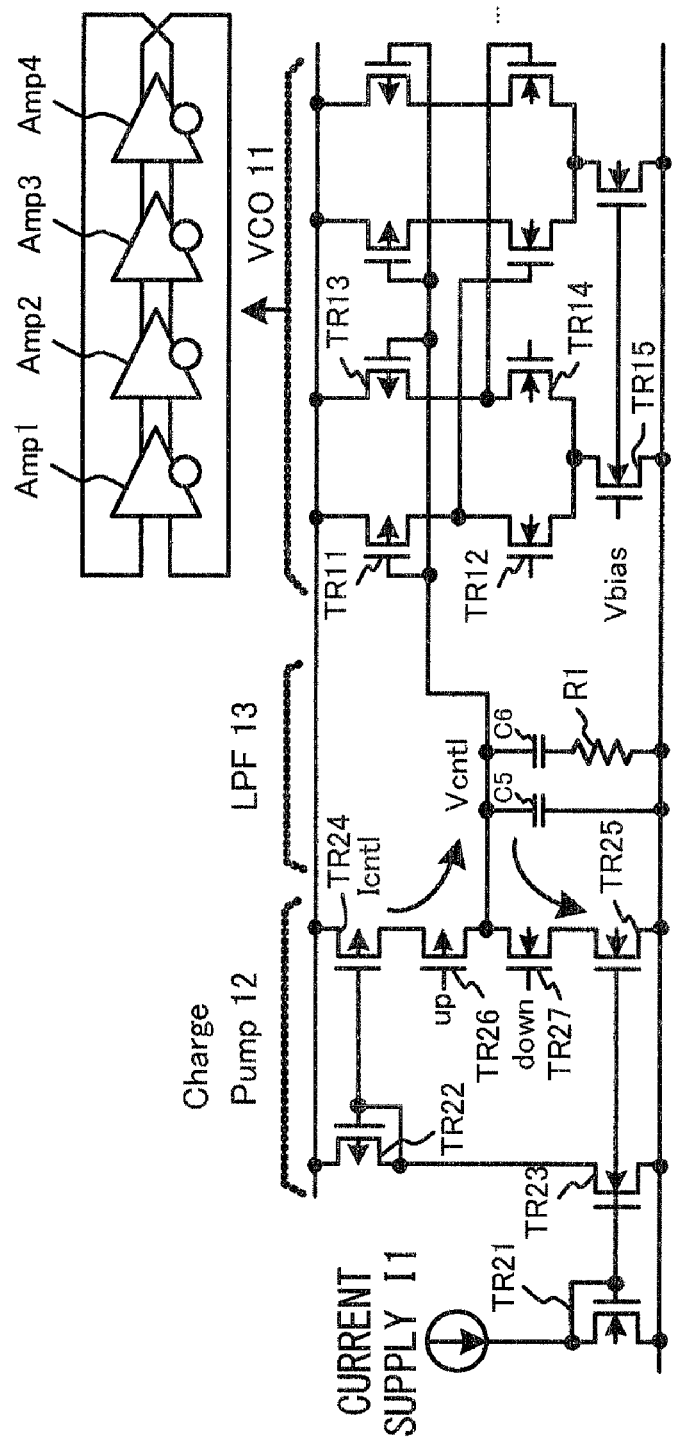
F I G. 19

US 7,659,760 B2

PLL CIRCUIT AND SEMICONDUCTOR INTEGRATED DEVICE

CROSS REFERENCE TO RELATED APPLICATION

This application is a continuation of PCT application of PCT/JP2006/301588, which was filed on Jan. 31, 2006.

BACKGROUND

1. Technical Field

The present invention relates to a phase-locked loop (PLL) circuit and a semiconductor integrated device having the PLL circuit.

2. Description of the Related Art

A PLL circuit comprises a voltage-controlled oscillator, a frequency divider, a phase comparator for detecting the phase difference between an internal clock signal divided by the frequency divider and a reference frequency signal, a charge pump circuit for outputting a voltage in accordance with the output of the phase comparator, and a low-pass filter.

FIG. 19 is the circuit diagram of the primary part of a conventional PLL circuit. A voltage-controlled oscillator 11, a charge pump circuit 12, and a low-pass filter (LPF) 13, all of which are included in the PLL circuit, are shown in FIG. 19.

Referring to FIG. 19, the voltage-controlled oscillator (VCO) 11 is configured to connect four differential amplifiers Amp1 through Amp4 in a ring. The differential amplifier Amp1 comprises cascade-connected p-channel MOS transistor TR11 and n-channel MOS transistor TR12; cascade-connected p-channel MOS transistor TR 13 and n-channel MOS transistor TR14; and n-channel MOS transistors TR15 which is connected between the respective sources of the n-channel MOS transistors TR12 and TR14 and a ground. The other differential amplifiers Amp2 through Amp4 are configured in the same manner. A control voltage Vcntl is provided from the low-pass filter to the voltage-controlled oscillator 11 for controlling the oscillation frequency.

The charge pump circuit 12 is constituted by a current mirror circuit and a switch circuit for charging or discharging the capacitors C5 and C6 of the low-pass filter 13.

A current proportional to the current output from a current supply I1 to a MOS transistor TR21 flows in MOS transistors TR22 and TR23, and the same current as that flowing in MOS transistor TR22 flows in MOS transistor TR24.

An UP signal for controlling the direction of increasing a control voltage is given to the gate of MOS transistor TR26 of the charge pump circuit 12, while a DOWN signal for controlling the direction of decreasing a control voltage is given to the gate of MOS transistor TR27 of the charge pump circuit 12.

When the UP signal is positive, MOS transistor TR26 is turned on to charge the capacitors C5 and C6, hence increasing the control voltage Vcntl. This causes the oscillation frequency of the voltage-controlled oscillator 11 to be higher.

When the DOWN signal is positive, the MOS transistor TR27 is turned on to discharge the charges of the capacitors C5 and C6 by way of the MOS transistor TR25, hence decreasing the control voltage Vcntl. This causes the oscillation frequency of the voltage-controlled oscillator 11 to be lower.

A technique for enabling a phase comparison of a burst digital signal in the phase comparator of a PLL circuit detecting a frequency and comparing phases is known.

Further, it is known that if the pulse width of a phase comparison signal output from a phase comparator is wide, jitter generated in a charge pump circuit is reduced.

The number of transistors incorporated in a single semiconductor device has been on the increase and the operating frequency of the device has been increasing with the miniaturization of CMOS technology. A method called power supply voltage scaling is used for a logic circuit in order to reduce the power consumption so that many logic-use integrated circuits (IC) are designed to use power supply voltages around 0.8 volts to 1.2 volts.

Although it is also desired that the above noted PLL circuit will have its power supply voltage decreased down to between 0.8 and 1.2 volts in order to reduce the power consumption, when the power supply voltage is lower the problem arises that the operable voltage range of the circuit is narrowed because the charge pump circuit 12 of the PLL circuit uses a current mirror circuit.

FIG. 20 is a diagram showing the operable range of a current mirror circuit constituted by MOS transistors in conjunction with changing power supply voltages. The threshold voltage of a MOS transistor does not change with the power supply voltage VDD and therefore a reduction thereof narrows the operable voltage range of the current mirror circuit, which reduces the operating voltage margin of the circuit. The circuit operation of a circuit cascade-connecting MOS transistors in multiple stages, such as a current mirror circuit, becomes unstable if the power supply voltage is reduced and so is the PLL circuit.

SUMMARY

According to the present invention, a PLL circuit comprises, a charge/discharge control circuit for outputting a power supply voltage or a ground voltage, plural capacitors; a first switch group including plural switches which are respectively connected to the plural capacitors and which selectively supply the plural capacitors with the output of the charge/discharge control circuit, a second switch group including plural switches respectively connected to the plural capacitors, and a control circuit for controlling the charge/discharge control circuit so that it outputs either a power supply voltage or a ground voltage on the basis of the phase difference between a reference frequency signal and the oscillation frequency signal of a voltage-controlled oscillator or an internal clock signal that is obtained by dividing the oscillation frequency signal, and for controlling the selecting of a specific capacitor from among the plural capacitors by turning on and off the first switch group individually, controlling the charging or discharging of the specific capacitor by using the output of the charge/discharge control circuit, and then controlling the sharing of an electric charge with a capacitor, the electric charge being stored in the specific capacitor by turning on and off the second switch group individually, the capacitor retaining a control voltage that controls the oscillation frequency of the voltage-controlled oscillator, or controlling the sharing of the electric charge of the capacitor retaining the control voltage with the specific capacitor.

BRIEF DESCRIPTION OF THE DRAWINGS

FIG. 1 is a circuit block diagram of a PLL circuit according to a preferred embodiment;

FIG. 2 is a diagram showing the basic compositions of a charge pump circuit and a control circuit;

FIG. 4 is a block diagram of a control circuit according to a first preferred embodiment;

FIG. 9 is a block diagram showing a phase comparator and a control circuit according to a second preferred embodiment;

FIG. 11 is a diagram showing the relationship between Vcntl and ΔVcntl relating to a capacitance value;

FIG. 18 is a timing chart showing the operation of the charge pump circuit according to the fourth embodiment;

FIG. 19 is a circuit diagram of a conventional PLL circuit; and

DESCRIPTION OF THE PREFERRED EMBODIMENTS

Figure 3:
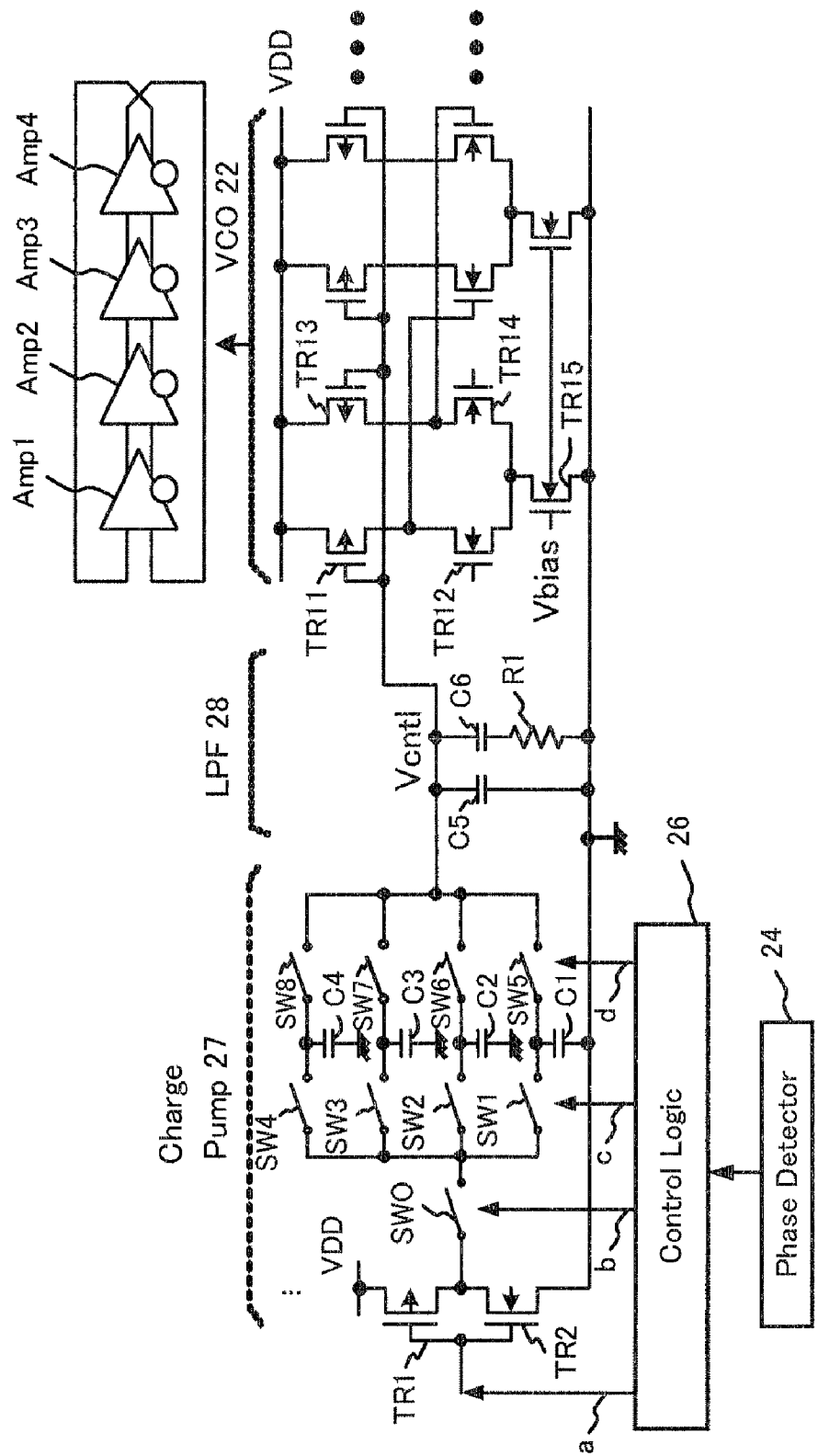
FIG. 3 is a diagram showing the primary composition of a PLL circuit according to a preferred embodiment.

The following is a description of the preferred embodiments of the present invention by referring to the accompanying drawings. FIG. 1 is the circuit block diagram of a PLL circuit 21 according to a preferred embodiment. The PLL circuit 21 according to the embodiment is formed on a semiconductor integrated device, e.g., a MOS integrated circuit.

Referring to FIG. 1, the oscillation frequency signal VCO CLK of a VCO 22 is divided by a frequency divider 23 and output to a phase comparator 24. The phase comparator 24 (or a frequency detector 25) detects the phase difference between an internal clock signal Inner CLK divided by the frequency divider 23 and a reference frequency signal Ref CLK and outputs, to a control circuit (i.e., control logic) 26, a signal (including a signal indicating a frequency difference) in accordance with the phase difference.

FIG. 1 shows the case of the phase comparator 24 outputting an UP signal and a DOWN signal, which indicate the frequency difference between the reference frequency signal Ref CLK and internal clock signal Inner CLK. The following description describes the phase comparator 24 comprehending a circuit (i.e., the frequency detector 25) outputting a signal indicating the direction of increasing or decreasing the oscillation frequency of the voltage-controlled oscillator 22 and indicating the frequency difference between the reference frequency signal and internal clock signal.

A control circuit 26 outputs a control signal for turning on and off the switch group (which is described later) of a charge pump circuit 27.

The charge pump circuit 27 supplies a capacitor that retains the control voltage Vcntl of a low-pass filter (LPF) 28 with the electric charge of one or plural capacitors, or discharges the electric charge of a capacitor of the low-pass filter 28.

The low-pass filter 28 outputs the voltage of an internal capacitor as a control voltage Vcntl for controlling the oscillation frequency of the voltage-controlled oscillator 22.

FIG. 2 is a diagram showing the basic compositions of the charge pump circuit 27 and control circuit 26 according to a preferred embodiment. The following description exemplifies the case of the charge pump circuit 27 comprising four capacitors and switches wherein the number of switches corresponds to that of the capacitors. Note that the respective number of capacitors and switches used for the charge pump circuit 27 may be discretionary, in lieu of being limited to four.

The charge pump circuit 27 comprises a p-channel MOS transistor TR1 and an n-channel MOS transistor TR2 (which correspond to a charge/discharge control circuit) which are serially connected between the power supply voltage VDD and a ground, a switch SW0 (corresponding to a third switch), four switches SW1 through SW4 (corresponding to a first switch group), four capacitors C1 through C4 (corresponding to plural capacitors), and four switches SW5 through SW8 (corresponding to a second switch group).

The control circuit 26 provides the gates of the p-channel MOS transistor TR1 and n-channel MOS transistor TR2 with a control signal "a" which determines whether the capacitors C1 through C4 are to be charged or discharged.

The switch SW0 is connected between the switches SW1 through SW4 and the connection point of the p-channel MOS transistor TR1 and n-channel MOS transistor TR2, and the control circuit 26 provides the control terminal (not shown in a drawing herein) of the switch SW0 with a control signal "b" for turning on and off the switch SW0.

One terminal of each of the switches SW1 through SW4 is commonly connected to the switch SW0. The other terminal of the switch SW1 is connected to the capacitor C1, other terminal of the switch SW2 is connected to the capacitor C2, the other terminal of the switch SW3 is connected to the capacitor C3 and the other terminal of the switch SW4 is connected to the capacitor C4. The control terminal of the switches SW1 through SW4 is provided, by the control circuit 26, with a control signal group "c" for turning on and off the respective switches individually. A specific switch from among the switches SW1 through SW4 is turned on by the control signal group "c" such that a specific capacitor (i.e., one or plural capacitors) of the capacitors C1 through C4 are charged to the power supply voltage VDD or are discharged the electric charge of a specific capacitor down to the ground potential.

The capacitors C1, C2, C3 and C4 are designed to have capacitance values satisfying the relationship of 1C: 2C: 3C: 4C (where C is a discretionary capacitance value), with the other terminals of the capacitors C1 through C4 being grounded. Note that the symbols C1, C2, C3 and C4 shown in the parentheses close to the respective capacitors C1 through C4 shown in FIG. 2 indicate the capacitance ratios of the capacitors.

One terminal of the switch SW5 is connected to the capacitor C1, that of the switch SW6 is connected to the capacitor C2, that of the switch SW7 is connected to the capacitor C3, and that of the switch SW8 is connected to the capacitor C4. The respective other terminals of the switches SW5 through SW8 are commonly connected to the low-pass filter 28. The control terminals (not shown in a drawing herein) are provided, by the control circuit 26, with a control signal group "d" for turning on and off the respective switches individually.

FIG. 3 is a diagram showing the primary composition of the PLL circuit 21. The low-pass filter 28 comprises the parallel connection of a capacitor C5 and the serial connection of a capacitor C6 and a resistor R1. The one terminal of the capacitor C5 and that of the capacitor C6 are commonly connected to the switches SW5 through SW8 of the charge pump circuit 27, the other terminal of the capacitor C5 is grounded, and the other terminal of the capacitor C6 is grounded by way of the resistor R1.

The voltage-controlled oscillator 22 comprises differential amplifiers Amp1 through Amp4, which are connected in a ring. The configurations of the differential amplifiers Amp1 through Amp4 are the same as those of the conventional PLL circuit shown in FIG. 19.

At this point, a description of the operation of the above described charge pump circuit 27 is provided. The control circuit 26 turns on one of the MOS transistors TR1 and TR2, turns off the other thereof on the basis of a signal (which is noted as "phase difference" hereinafter) and turns on the switch SW0, the signal indicating the phase difference or frequency difference between the internal clock signal output from the phase comparator 24 and a reference frequency signal. Further, the control circuit 26 determines a charging capacity or discharging capacity in accordance with the phase difference and turns on and off the switches SW1 through SW4 selectively so that the capacitance of the charge pump circuit 27 maintains a desired capacitance value.

When a specific capacitor of the capacitors C1 through C4 is charged to the power supply voltage VDD, or discharged to the ground potential, the switch SW0 is turned off, and the switches SW5 through SW8 are individually turned on and off to share the electric charge stored in the capacitors C1 through C4 with the capacitors C5 and C6 of the low-pass filter 28. Alternatively, the electric charge stored in the capacitors C5 and C6 of the low-pass filter 28 is shared with the capacitors C1 through C4. Note that the capacitance values of the capacitors C1 through C4 are set at smaller values than those of the capacitors C5 and C6 of the low-pass filter 28.

Here, defining the present control voltage retained by the capacitors C5 and C6 of the low-pass filter 28 as Vcntl, defining the voltage supplied to the switches SW1 through SW4 as Vb (e.g., the power supply voltage VDD), defining the capacitance of the capacitors when the switches SW1 through SW4 are selectively turned on as kC, and defining the parallel capacitance of the capacitors C5 and C6 of the low-pass filter as Ccntl, and then the control voltage Vcntl (next) output from the low-pass filter 28 is represented by the following expression:

$$Vcntl(\text{next})=(Vb*kC+Vcntl*Ccntl)/(kC+Ccntl)$$

The above expression makes it comprehensible that when the voltage is determined to be constant, the control voltage Vcntl can be controlled at a desired value by selectively turning on the switches SW1 through SW4 to vary the capacitance kC of the capacitor.

FIG. 4 is a block diagram of a control circuit 26 according to a first preferred embodiment.

The phase comparator 24 outputs, to the control circuit 26, an UP signal and a DOWN signal, which indicate the direction of increasing and decreasing, respectively, of the oscillation frequency of the voltage-controlled oscillator and also indicate the frequency difference between the internal clock signal Inner CLK and reference clock signal (i.e. reference frequency signal) Ref CLK.

The control circuit 26 comprises a D flip-flop 31 for latching the UP signal, a D flip-flop 32 for latching the DOWN signal, an UP counter 33 for counting up the output of the D flip-flop 31 at a timing that is synchronous with a VCO clock signal (i.e., an oscillation frequency signal) VCO CLK, and a DOWN counter 34 for counting down the output of the D flip-flop 32 at a timing that is synchronous with a VCO clock signal.

The control circuit 26 further comprises a polarity judgment circuit 35 for judging the charge polarity of the capacitors C1 through C4 on the basis of the count value of the UP counter 33 and that of the DOWN counter 34, and a capacitance judgment circuit 36 for judging the capacity of the charge/discharge on the basis of the count value of the UP counter 33 and that of the DOWN counter 34.

In addition, the control circuit 26 is also equipped with a circuit (which is not shown in a drawing herein) for outputting a control signal "b" to turn on the switch SW0 when charging or discharging the capacitors C1 through C4, and to turn off the switch SW0 when sharing the electric charge stored in the capacitors C1 through C4 with the capacitors C5 and C6 of the low-pass filter 28 or when sharing the electric charge stored in the capacitors C5 and C6 of the low-pass filter 28 with the capacitors C1 through C4.

Figure 5:
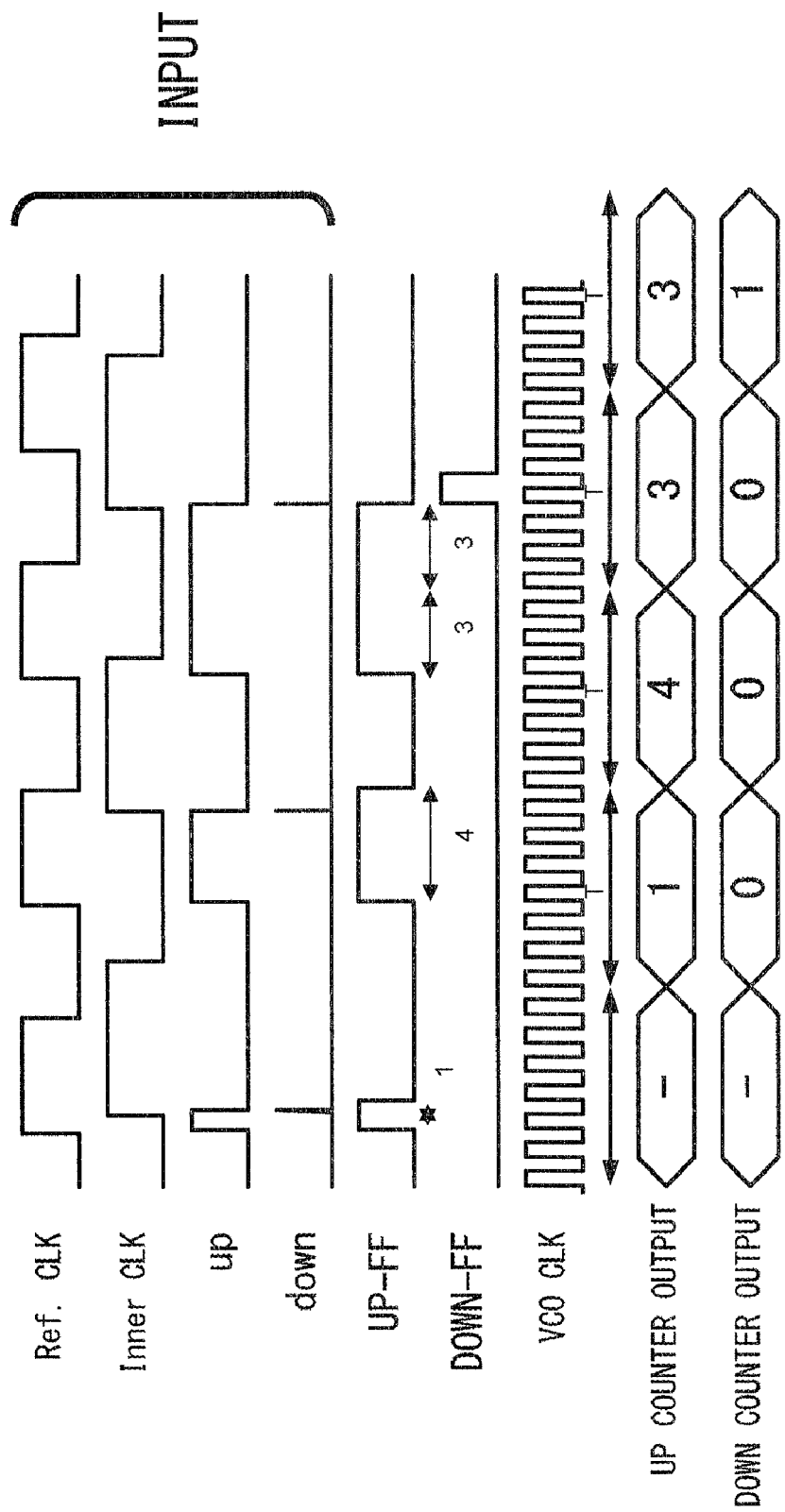
FIG. 5 is a timing chart showing the operation of the control circuit according to the first embodiment.

FIG. 5 is a timing chart showing the operation of the control circuit 26 according to the first embodiment. The following is a description of the operation of the control circuit 26 shown in FIG. 4 by referring to the timing chart shown in FIG. 5.

The timing chart shown in FIG. 5 is a case in which the frequency of an internal clock signal Inner CLK is lower than that of a reference clock Ref CLK.

The phase comparator 24 outputs an UP signal having a pulse width equivalent to the phase difference between the rising edge of the reference clock Ref CLK and that of the internal clock signal Inner CLK. The D flip-flop 31 latches the UP signal at a timing synchronous with the VCO clock signal VCO CLK. The output of the D flip-flop 31 is shown as an UP-FF signal in FIG. 5, with the first pulse being a pulse width equivalent to one cycle of the VCO clock signal VCO CLK, the second pulse being a pulse width equivalent to four cycles of the VCO clock signal VCO CLK, and the third pulse width being a pulse width equivalent to three plus three cycles of the VCO clock signal VCO CLK. The numerical values "1", "4", "3" and "3", which are shown below the pulse of the UP-FF signal shown in FIG. 5, indicate how many cycles of the VCO clock signal VCO CLK they are equivalent to.

The D flip-flop 32 also latches a DOWN signal at a timing synchronous with the VCO clock signal VCO CLK. The output of the D flip-flop 32 is shown as the DOWN-FF signal in FIG. 5. If the frequency of the internal clock signal Inner CLK is lower than that of the reference frequency signal Ref CLK, the DOWN signal is a small-width pulse and therefore the DOWN-FF signal is at a low level in most of the period, as shown in FIG. 5.

The UP counter 33 counts up the UP-FF signals at a timing synchronous with the VCO clock signal VCO CLK during the period T, and outputs the count result.

The numerical values shown as the UP counter outputs in FIG. 5 indicate that the count value of the pulse width of the first pulse of the UP-FF signal is "1", the count value of the pulse width of the second pulse is "4", the count value of the first half of the pulse width of the third pulse in the T period is "3", and the count value of the second half thereof in the T period is "3". In this event, the output of the DOWN counter 34 is "0", and then the output is "1" at the end, as shown in FIG. 5.

Figure 6:
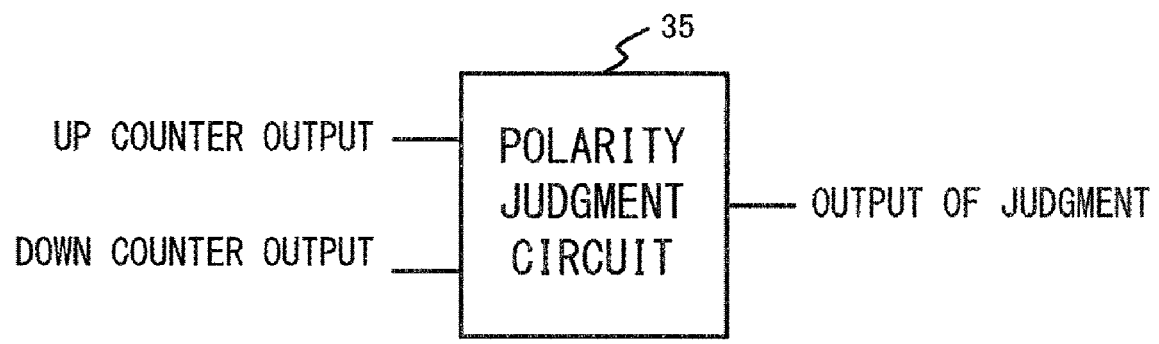
FIG. 6 is a diagram describing the operation of a polarity judgment circuit.
Figure 6:
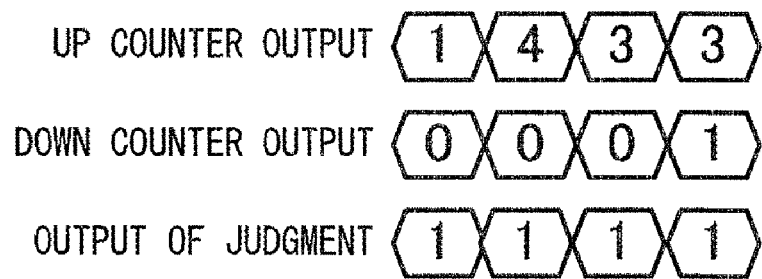
Figure 7:
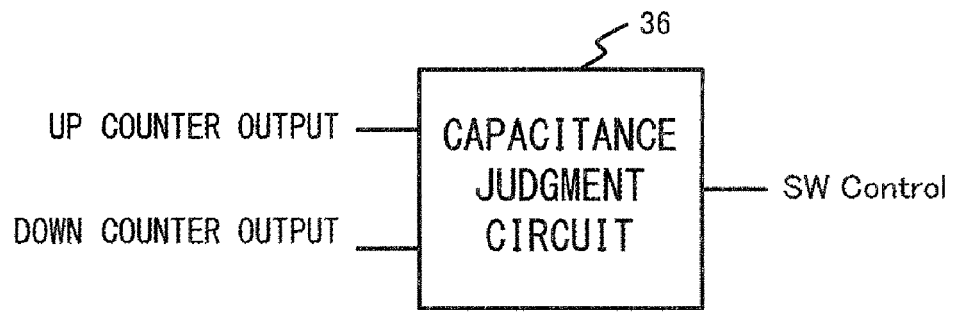
FIG. 7 is a diagram describing the operation of a capacitance judgment circuit.
Figure 7:
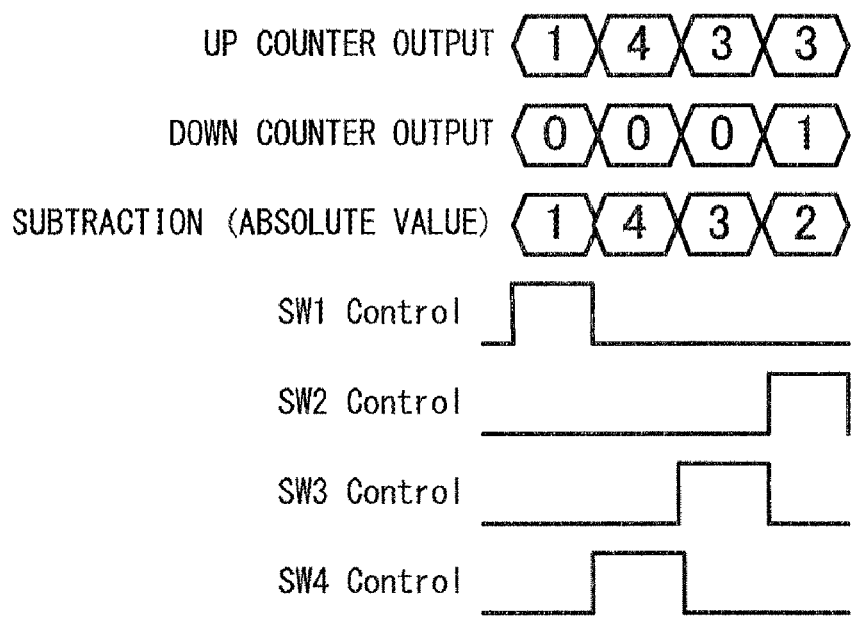

Next is a description of the operations of the polarity judgment circuit 35 and capacitance judgment circuit 36 when the above described count values are output from the UP counter 33 and DOWN counter 34 by referring to the operation description diagrams shown in FIGS. 6 and 7.

FIG. 6 is a diagram describing the operation of the polarity judgment circuit 35 when the count value of the UP counter 33 is larger than that of the DOWN counter 34.

The polarity judgment circuit 35 compares the output of the UP counter 33 with that of the DOWN counter 34, thereby judging the polarity of a charge. For example, if the count value of the UP counter 33 is larger than that of the DOWN counter 34, the polarity judgment circuit 35 outputs "1" as the judgment result, while if the count value of the UP counter 33 is smaller than that of the DOWN counter 34, it outputs "0" as the judgment result.

If the polarity judgment circuit 35 outputs "1" as the judgment result, the control circuit 26 outputs a control signal "a" for turning on the p-channel MOS transistor TR1 and turning off the n-channel MOS transistor TR2. As a result, the power supply voltage VDD is supplied to the switches SW1 through SW4.

In contrast, if the polarity judgment circuit 35 outputs "0" as the judgment result, the control circuit 26 outputs a control signal "a" for turning off the p-channel MOS transistor TR1 and turning on the n-channel MOS transistor TR2. As a result, the ground voltage is supplied to the switches SW1 through SW4.

That is, when increasing the frequency of the internal clock signal Inner CLK, the polarity judgment circuit 35 outputs "1" as the output of the judgment for charging the capacitors C1 through C4, and when decreasing the frequency of the internal clock signal Inner CLK, the polarity judgment circuit 35 outputs "0" as the output of the judgment for discharging from the capacitors C1 through C4.

FIG. 7 is a diagram describing the operation of the capacitance judgment circuit 36 when the count value of the UP counter 33 is larger than that of the DOWN counter 34.

The capacitance judgment circuit 36 judges capacitance on the basis of the absolute value of the difference between the count value of the UP counter 33 and that of the DOWN counter 34. In specific, if the absolute value of the difference between the count value of the UP counter 33 and that of the DOWN counter 34 is no more than "1", the capacitance judgment circuit 36 outputs a switch control (i.e., SW Control) signal for selecting the capacitor C1 with the smallest capacitance value. In this event, the capacitance judgment circuit 36 outputs signals, as switch control signals (i.e., a control signal group c), for turning on the switch SW1 and turning off the other switches SW2 through SW4, as shown in FIG. 7.

If the absolute value of the difference between the count value of the UP counter 33 and that of the DOWN counter 34 is no less than a predetermined value (e.g., no less than "4"), the capacitance judgment circuit 36 outputs the switch control signals for selecting the capacitor C4 with the maximum capacitance value.

Further, if the absolute value of the difference between the count value of the UP counter 33 and that of the DOWN counter 34 is between "3" and "4" (not inclusive), the capacitance judgment circuit 36 outputs the switch control signals for selecting the capacitor C3 with the second largest capacitance value. In this event, the capacitance judgment circuit 36 outputs the switch control signals for turning on the switch SW3 and turning off the other switches SW1, SW2 and SW4 as shown in FIG. 7.

Furthermore, if the absolute value of the difference between the count value of the UP counter 33 and that of the DOWN counter 34 is between "2" and "3" (not inclusive) the capacitance judgment circuit 36 outputs the switch control signals for selecting the capacitor C2 having the third largest capacitance value. In this event, the capacitance judgment circuit 36 outputs the switch control signals for turning on the switch SW2 and turning off the other switches SW1, SW3 and SW4 as shown in FIG. 7.

After charging a capacitor having a desired capacitance value by turning on the switches SW1 through SW4 selectively, the control circuit 26 outputs the control signal "b" for turning off the switch SW0 to separate the MOS transistors TR1 and TR2 from the switches SW1 through SW4. Then the control circuit 26 outputs, to the switches SW5 through SW8, a control signal group "d" for turning on the switches SW5 through SW8 selectively in order to share the electric charge stored in the charged capacitor with the capacitors C5 and C6 of the low-pass filter 28.

A repetition of the above described control for a plurality of times, that is, turning on the switches SW1 through SW4 selectively, charging a specific capacitor from among the capacitors C1 through C4, and turning on the switches SW5 through SW8 selectively, shares the electric charge stored in a specific capacitor from among the capacitors C1 through C4 with the capacitors C5 and C6 of the low-pass filter 28, or shares the electric charge stored in the capacitors C5 and C6 of the low-pass filter 28 with a specific capacitor presently at the ground voltage. This process makes it possible to control the control voltage Vcntl to be maintained at a desired value, thereby causing the oscillation frequency of the voltage-controlled oscillator 22 to follow a target frequency. The present embodiment is configured to control the capacitors C5 and C6 at a desired control voltage Vcntl by turning on and off SW1 through SW8 for a plurality of times since the capacitance values of the capacitors C1 through C4 are designed to be smaller than those of the capacitors C5 and C6. The configuration of making the capacitance values of the capacitors C1 through C8 small as described above makes it possible to finely control the control voltage.

The operation of the capacitance judgment circuit 36 shown in FIG. 7 has been described by exemplifying the case of charging one capacitor from among the plurality of capacitors C1 through C4 by turning on one switch from among the switches SW1 through SW4; an alternative configuration may be to turn on a plurality of switches simultaneously to charge, or discharge from, a plurality of capacitors simultaneously.

Such a configuration makes it possible to, for example, parallelly connect a plurality of capacitors having different capacitance values and to make a desired capacity be charged to the power supply voltage VDD, or be discharged to the ground voltage, thereby enabling a fine control of the control voltage Vcntl. Further, the configuration makes it possible to attain a large capacity by combining capacitors having small capacitance values, thereby minimizing the device area size of capacitors when forming a PLL circuit on a semiconductor integrated circuit.

Figure 8:
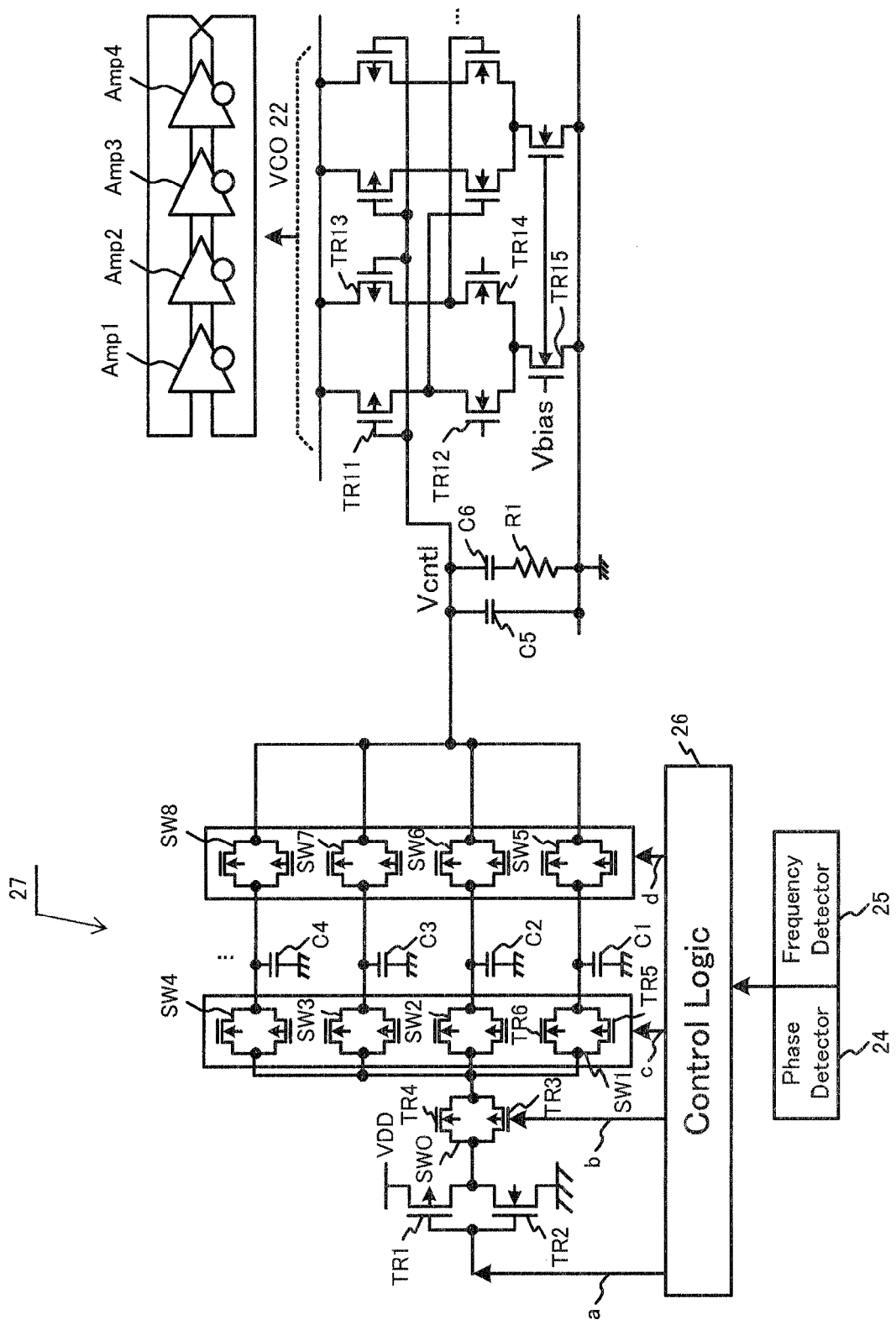
FIG. 8 is a diagram exemplifying a charge pump circuit.

FIG. 8 exemplifies the switches SW0 and SW1 through SW8 of the charge pump circuit 27 shown in FIGS. 2 and 3 constituted by transfer gates. In FIG. 8, a description of the same circuit as FIGS. 2 and 3 is not provided here.

The switch SW0 is constituted by a transfer gate in which a p-channel MOS transistor TR3 and an n-channel MOS transistor TR4 are parallelly connected.

The source of the p-channel MOS transistor TR3 is connected to the drain of the n-channel MOS transistor TR4, with the connection point being connected to the connection point between the p-channel MOS transistor TR1 and n-channel MOS transistor TR2. Further, the drain of the p-channel MOS transistor TR3 and the source of the n-channel MOS transistor TR4 are connected to one end of each of the respective switches SW1 through SW4.

Each of the switches SW1 through SW4 and SW5 through SW8 is also constituted by a transfer gate in which a p-channel MOS transistor and an n-channel MOS transistor are parallelly connected. The switch SW1 is constituted by a transfer gate in which a p-channel MOS transistor TR5 and n-channel MOS transistor TR6 are parallelly connected. Each of the other switches SW2 through SW8 is also constituted by a transfer gate in a similar manner.

The above described first embodiment is configured such that the charge pump circuit 27 comprises two transistors, a plurality of switches and a plurality of capacitors, thereby making it possible to change the control voltage without employing a current mirror circuit. This configuration enables an implementation of a PLL circuit operable stably at a low power supply voltage. The configuration also makes it possible to lower the power supply voltage of a semiconductor integrated device, thereby decreasing the power consumption of the circuit and the amount of heat generation in the device. This in turn makes it possible to suppress the cooling performance of a fan for cooling the semiconductor device. Alternatively, this eliminates a heat radiation member for the semiconductor device.

Next, FIG. 9 is a block diagram showing a phase comparator 41 and a control circuit 42 according to a second preferred embodiment.

The second embodiment comprises the phase comparator 41 for outputting three kinds of phase difference signals Phase0, Phase1 and Phase2, and the control circuit 42 for performing a polarity judgment and a capacitance judgment on the basis of the phase difference signals.

The phase comparator 41 comprises three D flip-flops (corresponding to a latch circuit) 43, 44 and 45, and two delay circuits 46 and 47. A clock signal Inner CLK2, which is an internal clock signal Inner CLK being delayed by the delay circuits 46 and 47 for a predetermined time period, is input into the clock terminal of the D flip-flop 43. The D flip-flop 43 latches the reference frequency signal Ref CLK at a timing synchronous with the clock signal Inner CLK2 and outputs the latched signal as a phase difference signal Phase0 indicating the phase difference of the clock signal Inner CLK2 against the reference frequency signal Ref CLK.

A clock signal Inner CLK1, which is an internal clock signal Inner CLK being delayed by the delay circuit 47 for a predetermined time, is input into the clock terminal of the D flip-flop 44. The D flip-flop 44 latches the reference frequency signal Ref CLK at a timing synchronous with the clock signal Inner CLK1 and outputs the latched signal as a phase difference signal Phase1 indicating the phase difference of the clock signal Inner CLK1 against the reference frequency signal Ref CLK.

An internal clock signal Inner CLK is input into the clock terminal of the D flip-flop 45. The D flip-flop 45 latches the reference frequency signal Ref CLK at a timing synchronous with the internal clock signal Inner CLK and outputs the latched signal as a phase difference signal Phase2 indicating the phase difference of the internal clock signal Inner CLK against the reference frequency signal Ref CLK.

A polarity judgment circuit 48 determines the polarity of charge by judging whether or not the frequency of the internal clock signal Inner CLK is higher than that of the reference frequency signal Ref CLK on the basis of the phase difference signals Phase0, Phase1 and Phase2.

A capacitance judgment circuit 49 judges the capacitance of a capacitor to be charged, or discharged from, on the basis of the phase difference signals Phase0, Phase1 and Phase2.

Figure 10:
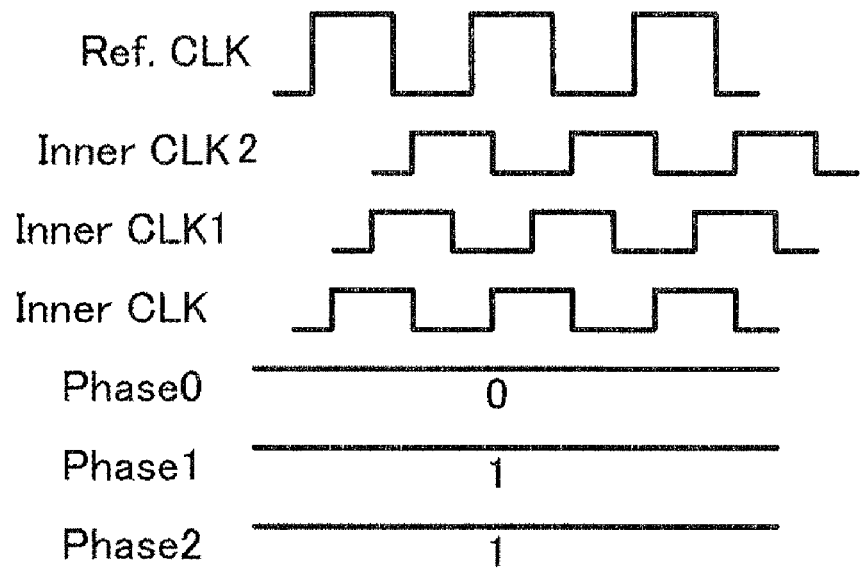
FIG. 10 is a timing chart showing the operation of the phase comparator according to the second embodiment.

At this time, the operation of the above described phase comparator 41 is described by referring to the timing chart shown in FIG. 10.

The clock signal Inner CLK1 shown in FIG. 10 is a signal which has delayed the internal clock signal Inner CLK by the delay time of the delay circuit 46 (i.e., a first delay time), and the clock signal Inner CLK2 is a signal which has delayed the internal clock signal Inner CLK by the delay time of the delay circuits 46 and 47 (i.e., a second delay time).

Therefore, if the phase difference between the reference frequency signal Ref CLK and internal clock signal Inner CLK is as shown in FIG. 10, the output signal Phase2 of the D flip-flop 45 in the case of latching the reference frequency signal Ref CLK at the rising edge of the internal clock signal Inner CLK is "1". Further, the output signal Phase1 of the D flip-flop 44 which has latched the reference frequency signal Ref CLK at the rising edge of the clock signal Inner CLK1 is "1", while the output signal Phase0 of the D flip-flop 43 which has latched the reference frequency signal Ref CLK at the rising edge of the clock signal Inner CLK2 is "0".

If the phase difference between the reference frequency signal Ref CLK and internal clock signal Inner CLK is larger than the example shown in FIG. 10 and if the value resulting from latching the reference frequency signal Ref CLK at the rising edge of the clock signal Inner CLK1 is "0", the signal Phase0 is "0". In this case, both the signals Phase0 and Phase1 are "0", and the signal Phase2 is "1".

Further, if the phase difference between the reference frequency signal Ref CLK and internal clock signal Inner CLK is equal to or larger than a certain value, both the output signal Phase1 of the D flip-flop 44 and the output signal Phase2 of the D flip-flop 43 are "0".

The polarity judgment circuit 48 judges the advance or delay of the phase of the internal clock signal Inner CLK against the reference frequency signal Ref CLK on the basis of the values of the signals Phase0, Phase1 and Phase 2.

The capacitance judgment circuit 49 determines the capacitance value in accordance with the phase difference on the basis of the values of the signals Phase0, Phase1 and Phase2.

The above described second embodiment is configured to enable both polarity judgment and capacitance judgment without using an UP signal or DOWN signal, thereby simplifying the circuit configuration of the phase comparator 41. Further, the control circuit can be constituted by the polarity judgment circuit 48, capacitance judgment circuit 49, and a circuit (not shown in a drawing herein) controlling turning on and off of the switch SW0, thereby further simplifying the circuit configuration compared to that of the first embodiment.

When the control voltage Vcntl is controlled with a charge pump circuit 27 having a variable charge or discharge capacitance, the higher the control voltage Vcntl gets, the smaller the control voltage change amount ΔVcntl gets per the same electric charge volume FIG. 11 is a diagram showing the relationship between the control voltage Vcntl and control voltage change amount ΔVcntl relating to the capacitance value of a capacitor of the charge pump circuit 27.

The horizontal axis of FIG. 11 indicates the values of control voltages Vcntl and the vertical axis indicates the values of control voltage change amounts ΔVcntl. Referring to FIG. 11, the straight line with the largest inclination indicates the characteristic of the control voltage change amount ΔVcntl of a capacitor of which the capacitance ratio relating to a capacitor having the minimum capacitance value is the maximum, that is, "64". The straight line with the next largest inclination indicates the characteristic of the control voltage change amount ΔVcntl of a capacitor of which the capacitance ratio is "32". Likewise, the other lines indicate the characteristics of the control voltage change amounts ΔVcntl of capacitors of which the capacitance ratios are, in sequence, "16", "8", "4", "2" and "1".

AS is clear from FIG. 11, the control voltage change amount ΔVcntl-next that results from the stored electric charge of the capacitor of the charge pump circuit 27 is large when the control voltage Vcntl is low, whereas the control voltage change amount ΔVcntl becomes very small as the control voltage Vcntl approaches 1.2 volts.

Therefore, even when the same capacitance value is selected on the basis of the UP signal or DOWN signal of the phase comparator 24, a target control voltage is very difficult to attain if the control voltage Vcntl is high. That is, the converging time for the PLL circuit to reach a target frequency is large if the control voltage Vcntl is high.

Figure 12:
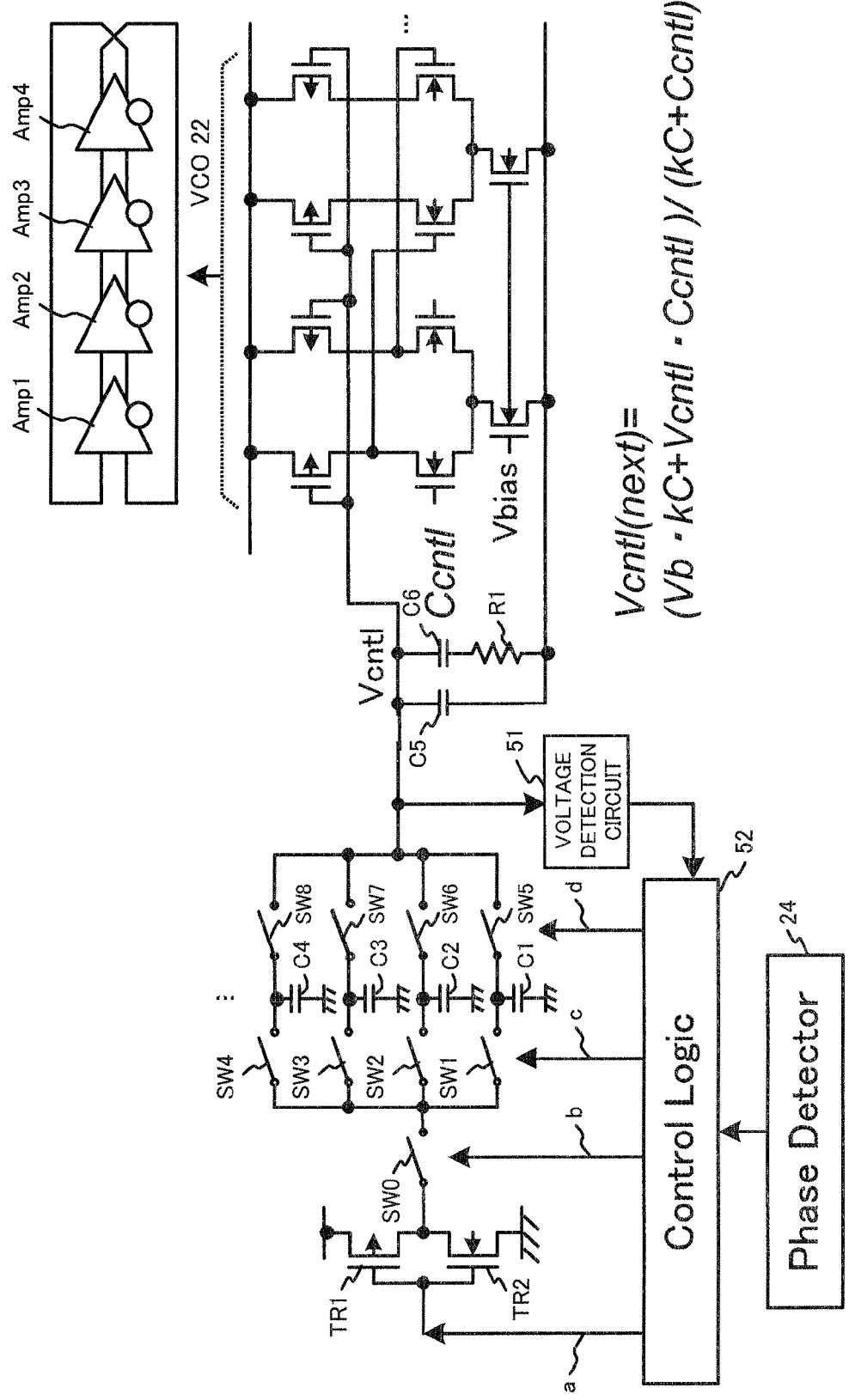
FIG. 12 is a diagram showing the primary composition of a PLL circuit according to a third preferred embodiment.

FIG. 12 is a diagram showing the primary composition of a PLL circuit according to a third preferred embodiment of the present invention. The third embodiment is configured to increase a charging capacity when the control voltage Vcntl is high, thereby obtaining a large control voltage change amount ΔVcntl. In FIG. 12, the same component sign is assigned to the same part as the circuit of FIG. 3 and the description is not provided here.

The third embodiment is configured to detect the control voltage Vcntl of a low-pass filter 28 by means of a voltage detection circuit 51 and to variably control the charging capacity of a charge pump circuit 27 on the basis of the detected control voltage.

Figure 13:
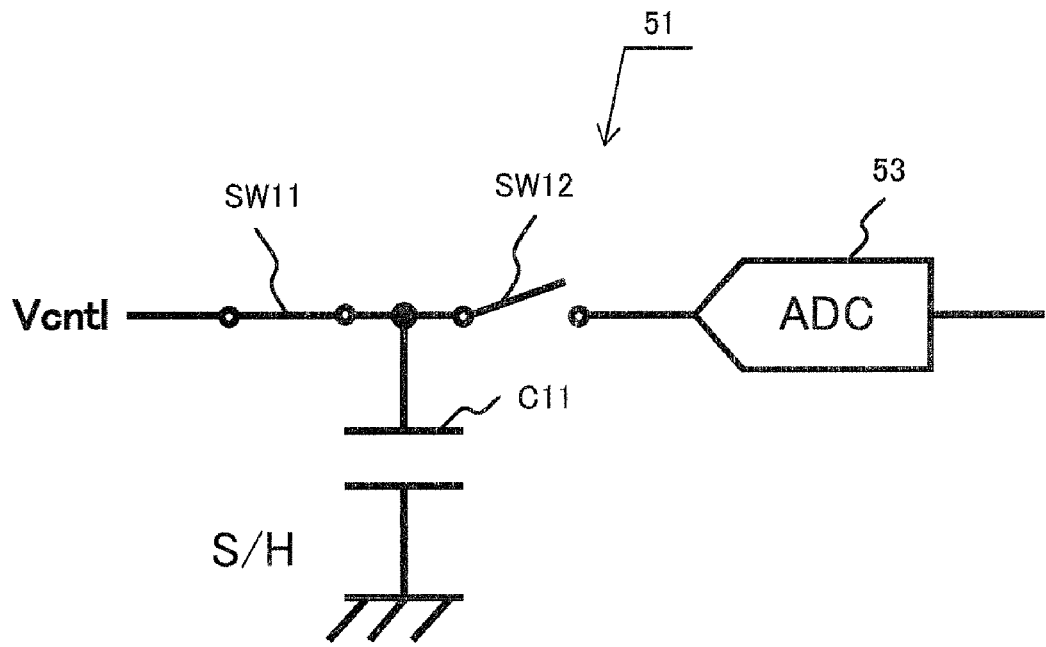
FIG. 13 is a block diagram of a voltage detection circuit.

FIG. 13 is a block diagram of a voltage detection circuit 51. The voltage detection circuit 51 comprises two switches SW11 and SW12, a capacitor C11, and an A/D converter (ADC) 53. The switches SW11 and SW12 and capacitor C11 constitute a sample-hold circuit.

The control voltage Vcntl of the low-pass filter 28 is retained by the capacitor C11 when the switch SW11 is turned on. Then, when the switch SW12 is turned on, the voltage retained by the capacitor C11 is converted into a digital value at the A/D converter 53 and output to a control circuit 52.

Figure 14:
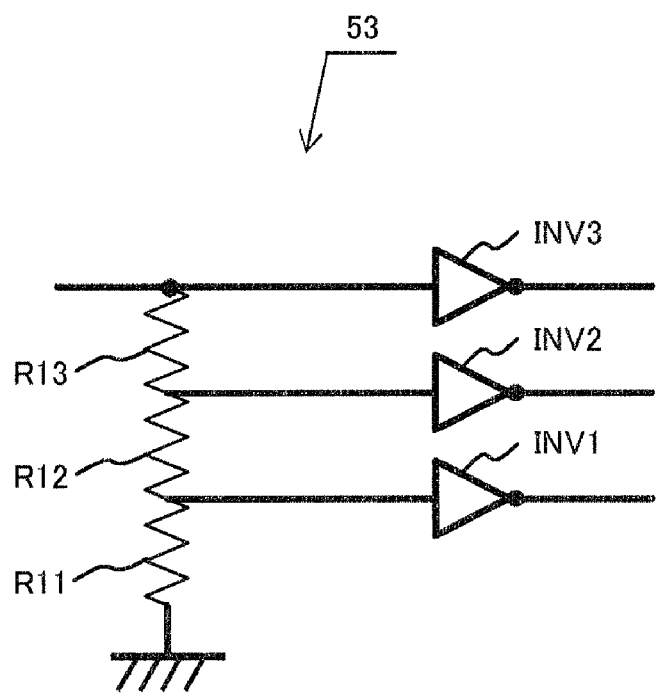
FIG. 14 is a diagram showing the composition of an A/D converter.

FIG. 14 is a diagram showing the composition of the A/D converter 53. The voltage at the capacitor C11 is divided by resistors R11, R12 and R13 and inputted into inverters INV1, INV2 and INV3, which then output "1" or "0" in accordance with the input voltages.

As an example, if the voltage across the resistor R11 and the ground is larger than the threshold voltage of the inverter INV1 when the control voltage Vcntl retained by the capacitor C11 is divided by the resistors R11, R12 and R13, then all the outputs of the inverters INV1, INV2 and INV3 will be "1". In contrast, if the voltage across the resistor R11 and the ground is smaller than the threshold voltage of the inverter INV1 and if the voltage across the resistor R12 and the ground is larger than the threshold voltage of the inverter INV2, then the output of the inverter INV1 is "0" and the outputs of the inverters INV2 and INV3 are "1".

Figure 15:
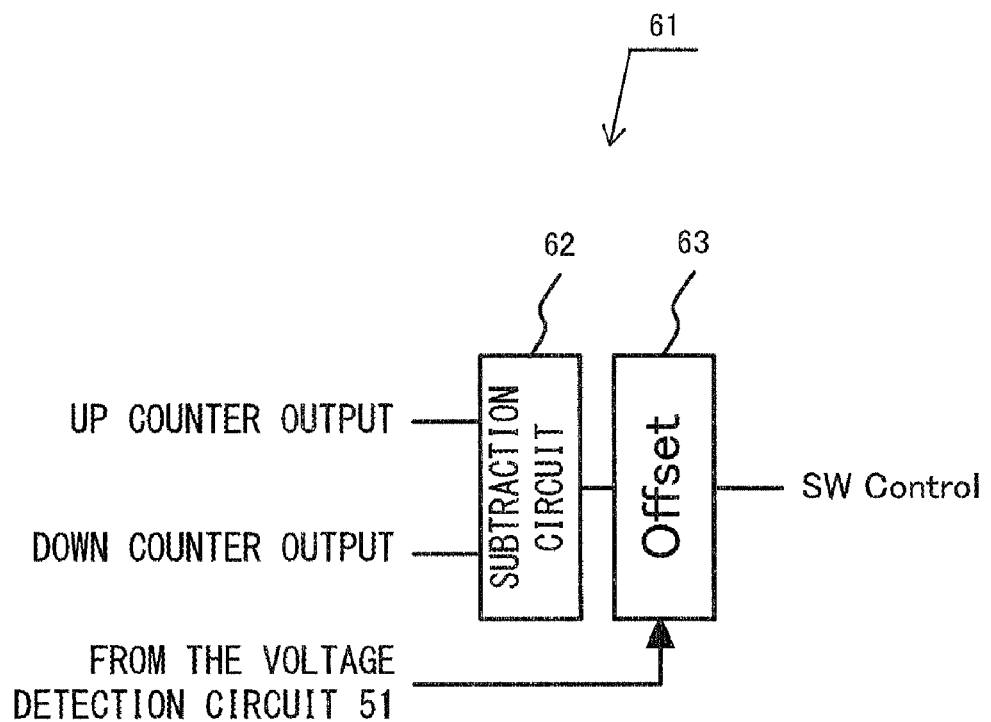
FIG. 15 is a diagram showing the composition of a capacitance judgment circuit.

FIG. 15 is a diagram showing the composition of the capacitance judgment circuit 61 of the control circuit 52. The capacitance judgment circuit 61 according to the third embodiment comprises a subtraction circuit 62 for calculating the absolute value of the difference between the count value of the UP counter 33 (shown in FIG. 4) and that of the DOWN counter 34 (shown in FIG. 4) and comprises an offset circuit 63 for adding an offset value to the output of the subtraction circuit 62.

The offset circuit 63 adds an offset value according to the digital value of the control voltage Vcntl output from the voltage detection circuit 51 to the output of the subtraction circuit 62 and outputs a switch control signal in accordance with the addition result.

In specific, the offset circuit 63 adds a small offset value to the output of the subtraction circuit 62 when the control voltage Vcntl is low and outputs a switch control signal to the switches SW1 through SW4 for selecting a small capacitance value. In contrast, the offset circuit 63 adds a large offset value to the output of the subtraction circuit 62 when the control voltage Vcntl is high and outputs a switch control signal to the switches SW1 through SW4 for selecting a large capacitance value.

Figure 16:
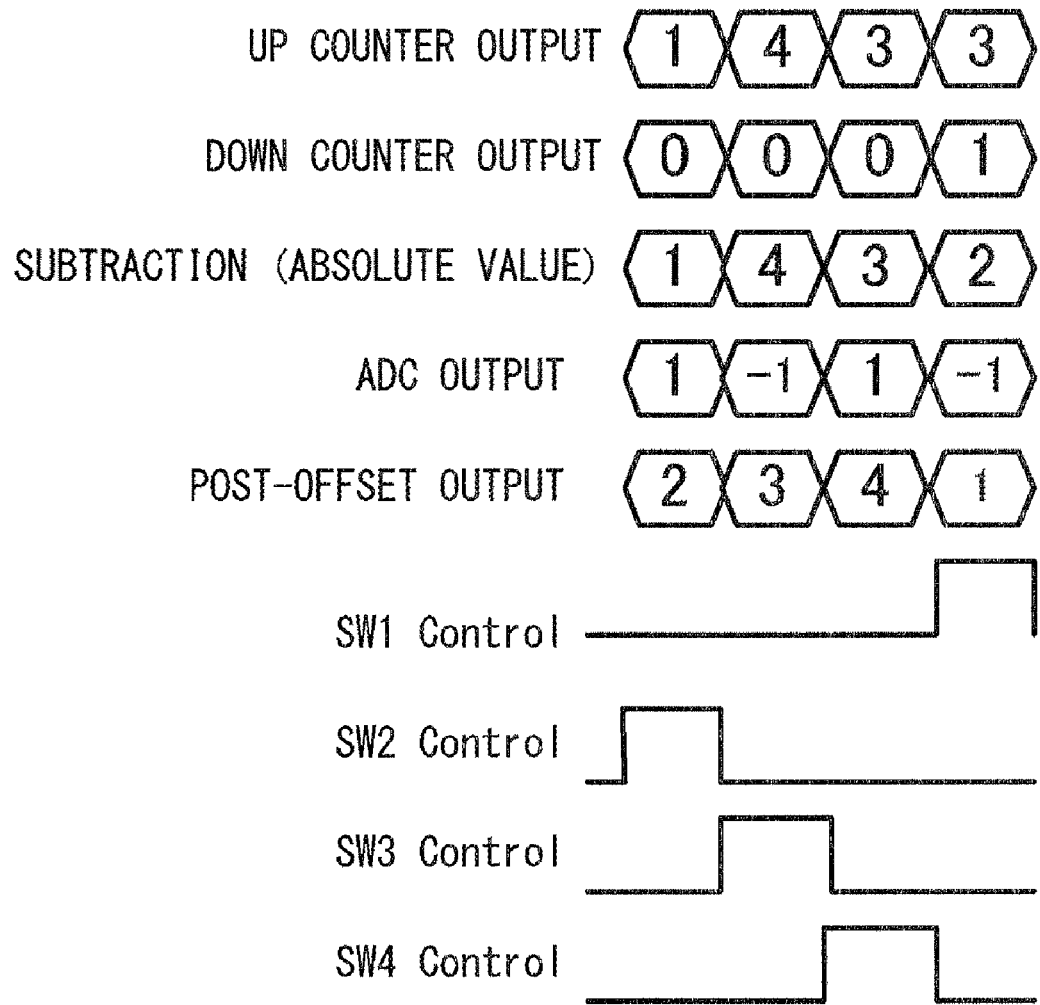
FIG. 16 is a diagram describing the operation of a control circuit according to the third embodiment.

FIG. 16 is a diagram describing the operation of the control circuit 52 according to the third embodiment.

As is shown in FIG. 16, when the count value of the UP counter 33 is "1", that of the DOWN counter 34 is "0" and the output of the A/D converter 53 (i.e., the digital value of the control voltage Vcntl) is "1", then the value obtained by adding the output "1" of the subtraction circuit 62 to the output "1" of the A/D converter 53 is obtained as the calculation result of the offset circuit 63.

In this case, the capacitance judgment circuit 61 of the control circuit 52 therefore outputs the switch control signals (i.e. a control signal group c) to the control terminal of the switches SW1 through SW4 for turning on the switch SW2 and turning off other switches SW1, SW3 and SW4 as shown in FIG. 16. That is, the capacitance judgment circuit 61 outputs the switch control signals for selecting the capacitor C2 having the second largest capacitance value as the charging capacity.

Meanwhile, when the count value of the UP counter 33 is "4", that of the DOWN counter 34 is "0", and the output of the A/D converter 53 is "−1", then the value "3", which is obtained by adding the offset value "−1" determined by the value of the present control voltage Vcntl to the output "4" of the subtraction circuit 62, is obtained as the calculation result of the offset calculation. Therefore, the capacitance judgment circuit 61 of the control circuit 52 outputs the switch control signals for turning on the switch SW3 and turning off the other switches SW1, SW2 and SW4. That is, the capacitance judgment circuit 61 outputs the switch control signals for selecting the capacitor C3 having the second largest capacitance value as the charging capacity.

When the count value of the UP counter 33 is "3", the count value of the DOWN counter 34 is "0", and the output of the A/D converter 53 is "−1", then the value "4", which is obtained by adding the offset value "1" determined by the value of the present control voltage Vcntl to the output "3" of the subtraction circuit 62, is obtained as the calculation result of the offset calculation. Therefore, the capacitance judgment circuit 61 of the control circuit 52 outputs the switch control signals for turning on the switch SW4 and turning off the other switches SW1, SW2 and SW3. That is, the capacitance judgment circuit 61 outputs the switch control signals for selecting the capacitor C4 having the largest capacitance value as the charging capacity.

In this event, the judgment results of the capacitance judgment circuit 61 are compared between the outputs of the subtraction circuit 62 being "4" and "3".

Even if the output of the subtraction circuit 62 is the maximum value, i.e., "4", the capacitance judgment circuit 61 outputs the switch control signals (i.e., the control signal group c) for charging the capacitor C3 having the second largest capacitance value when the control voltage Vcntl is low and the offset value is "−1".

Even if the output of the subtraction circuit 62 is "3", the capacitance judgment circuit 61 outputs the switch control signals for charging the capacitor C4 having the largest capacitance value when the control voltage Vcntl is high and the offset value is "1".

The above described third embodiment is configured to select, as a charging capacity, a larger capacitance value than that determined by the absolute value of the difference between the count value of the UP counter 33 and the count value of the DOWN counter 34 at the time when the control voltage Vcntl output from the low-pass filter 28 is high. This configuration makes it possible to increase the control voltage change amount ΔVcntl by increasing the charging capacity when the control voltage Vcntl output from the low-pass filter 28 is high. The increase of the control voltage change amount ΔVcntl makes it possible to cause the oscillation frequency of the voltage-controlled oscillator 22 to follow a target frequency in a shorter time.

Note that the above described third embodiment is configured to output a negative offset value when the control voltage Vcntl is smaller than a predetermined value; it may be alternatively configured to, instead of outputting a negative offset value, increase the capacitance value by adding a positive offset value only when the control voltage Vcntl is higher than the predetermined value.

Figures 17A, 17B:
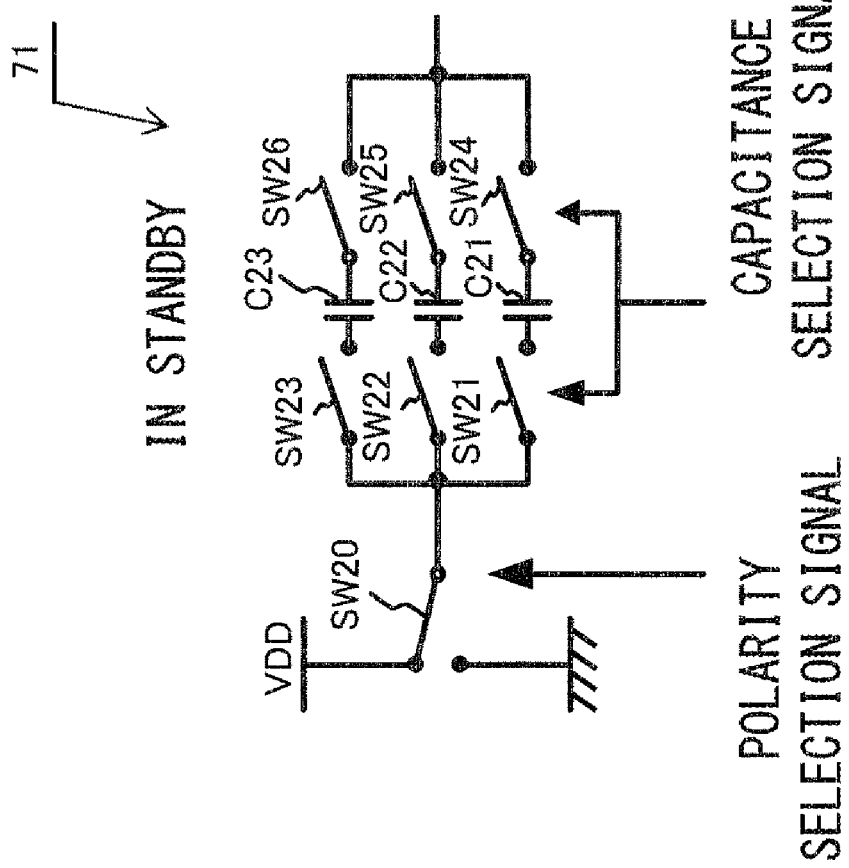
FIG. 17A and FIG. 17B are diagrams describing a charge pump circuit according to a fourth preferred embodiment.
Figure 20:
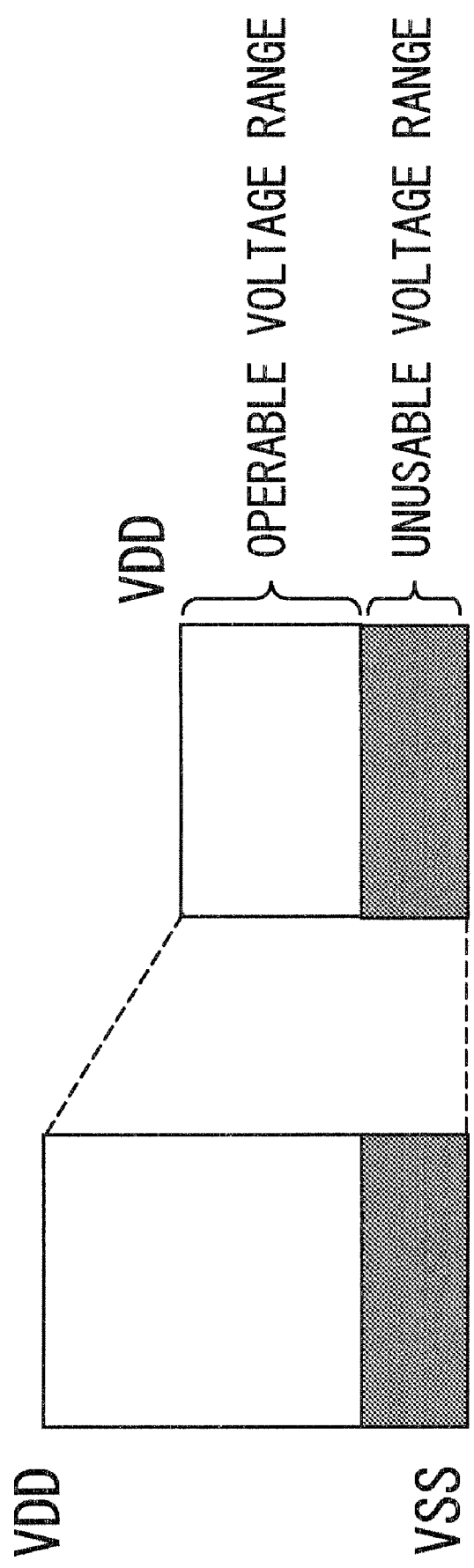
FIG. 20 is a diagram describing the operating voltage range of a current mirror circuit.

Next, FIG. 17A and FIG. 17B are diagrams describing a charge pump circuit 71 according to a fourth preferred embodiment.

The fourth embodiment is configured to connect a respective plurality of capacitors C21 through C23 between the circuit supplying the power supply voltage or ground voltage and the low-pass filter 28 shown in FIG. 2 and to change the capacitance values of the capacitors, thereby controlling a control voltage Vcntl.

The charge pump circuit 71 comprises a switch SW20 for changing over between the power supply voltage and ground voltage; switches SW21 through SW23 and switches SW24 through SW26, which are for selecting capacitance; and three capacitors C21, C22 and C23, which have different capacitance values. The respective terminals, on one end, of the switches SW21 through SW23 are commonly connected to the switch SW20, and the other terminals are connected to the respective terminals, on one end, of the capacitors C21, C22 and C23. The respective other terminals of the capacitors C21, C22 and C23 are connected to the respective terminals, on one end, of the switches SW24, SW25 and SW26. The respective other terminals of the switches SW24, SW25 and SW26 are commonly connected to a low-pass filter 28 (refer to FIG. 1), which is not shown in a drawing here.

The control terminal of the switch SW20 is provided with a polarity selection signal from a control circuit (not shown in a drawing herein), and the control terminals of the switches SW21 through SW23 and SW24 through SW26 are provided with a capacitance selection signal.

The switch SW20 comprises a p-channel MOS transistor TR1 and an n-channel MOS transistor TR2, which are serially connected as shown in FIG. 2.

Each of the switches SW21 through SW23 and SW24 through SW26 is constituted by a transfer gate shown in FIG. 8.

In standby, all of the switches SW20, SW21 through SW23, and SW24 through SW26 are turned off and no electric charge is accumulated in the capacitors C21 through C23 as shown in FIG. 17A.

When the control voltage Vcntl is to be changed, the switch SW20 is connected to the power supply voltage VDD or ground voltage as shown in FIG. 17B, and a specific switch from among the switches SW21 through SW23 and a specific switch from among the switches SW24 through SW26 are turned on.

FIG. 18 is a timing chart showing the operation of the charge pump circuit 71 according to the fourth embodiment.

Let it be assumed that, as shown in FIG. 18, the control circuit provides both a high level signal for selecting the power supply voltage VDD as the polarity selection signal and a signal for selecting the switches SW22 and SW25 as the capacitance selection signals. When the switches SW22 and SW25 are turned on, the capacitor C22 is charged to the power supply voltage VDD so that the present charged current flows in the capacitors C5 and C6 of the low-pass filter 28 by way of the capacitor C22. As a result, the control voltage Vcntl of the capacitors C5 and C6 of the low-pass filter 28 climbs by the amount indicated by the arrow in FIG. 18.

The change amount of the control voltage Vcntl can be controlled by changing the capacitance of the capacitor (and the period of time of turning on the switches SW21 through SW23 and SW24 through SW26). If, for example, a capacitor with a large capacitance is connected to the power supply voltage VDD, a large charging current flows in the capacitor and a current transiently flowing in the capacitors C5 and C6 of the low-pass filter 28 also increases, and therefore the change amount of the control voltage Vcntl of the capacitors C5 and C6 also increases. In contrast, if a capacitor with small capacitance is connected to the power supply voltage VDD, a small charging current flows in the capacitor and a current flowing in the capacitors C5 and C6 of the low-pass filter 28 also decreases, and therefore the change amount of the control voltage Vcntl of the capacitors C5 and C6 becomes small. The phenomenon is similar when the capacitors C21 through C23 are connected to the ground voltage.

The above described fourth embodiment is configured to change over the capacitance of the capacitors serially connected on the input side of the low-pass filter 28 by means of the switches SW21 through SW23 and SW24 through SW26 and to change the currents transiently flowing in the capacitors C21 through C23, thereby making it possible to control the control voltage Vcntl of the low-pass filter 28 discretionarily. The fourth embodiment is capable of variably controlling the control voltage Vcntl by changing over the capacitance of the capacitors C21 through C23, thereby enabling the operation of the charge pump circuit 71 even at a low power supply voltage.

The above described embodiment makes it possible to attain a PLL circuit operable at a low power supply voltage.

For example, the present invention may be configured in the following ways in lieu of being limited to the above described embodiments:

(1) The present invention is applicable to a circuit and a semiconductor integrated device that uses a bipolar transistor in lieu of being limited to those using a MOS transistor.

(2) The number of capacitors is discretionary in lieu of being limited to the four or three shown in the preferred embodiments.

(3) The phase difference signals of the phase comparator 41 may be of two kinds or of four kinds or more instead of three kinds, i.e., Phase0 through Phase2.

What is claimed is:

1. A phase-locked loop circuit, comprising:
a charge/discharge control circuit for outputting a power supply voltage or a ground voltage;
a plurality of capacitors;

a first switch group including plural switches which are respectively connected to the plural capacitors and which supply selectively the plural capacitors with the output of the charge/discharge control circuit;

a second switch group including plural switches respectively connected to the plurality of capacitors; and a control circuit for controlling the charge/discharge control circuit so that it outputs either a power supply voltage or a ground voltage on the basis of the phase difference between a reference frequency signal and the oscillation frequency signal of a voltage-controlled oscillator or an internal clock signal which is obtained by dividing the oscillation frequency signal, and for controlling the selecting of a specific capacitor from among the plural capacitors by turning on and off the first switch group individually, the charging or discharging of the specific capacitor by using the output of the charge/discharge control circuit, and then the sharing of an electric charge with a capacitor, the electric charge being stored in the specific capacitor by turning on and off the second switch group individually, the capacitor retaining a control voltage that controls the oscillation frequency of the voltage-controlled oscillator, or the sharing of the electric charge of the capacitor retaining the control voltage with the specific capacitor.

2. The phase-locked loop circuit according to claim 1, further comprising
a third switch connected between said charge/discharge control circuit and said first switch group, wherein
said control circuit turns on the third switch when the output of said charge/discharge control circuit is supplied to said specific capacitor and turns off the third switch when the electric charge stored in the specific capacitor is shared with said capacitor retaining said control voltage.

3. The phase-locked loop circuit according to claim 1, wherein
said control circuit comprises a polarity judgment circuit for judging a charge polarity on the basis of the phase difference between said reference frequency signal and said oscillation frequency signal or said internal clock signal and comprises a capacitance judgment circuit for judging a charging capacity or discharging capacity on the basis of the phase difference.

4. The phase-locked loop circuit according to claim 1, wherein
said charge/discharge control circuit comprises two transistors which are serially connected between a power supply and a ground, with one of the transistors being turned on when the other is turned off.

5. The phase-locked loop circuit according to claim 2, wherein
said first switch group comprises plural transistors, with the first electrodes of the plural transistors being commonly connected to the output terminal of said charge/discharge control circuit or to said third switch and the second electrodes being respectively connected to said plural capacitors.

6. The phase-locked loop circuit according to claim 1, wherein
said second switch group comprises plural transistors, with the first electrodes of the plural transistors being respectively connected to said plural capacitors and the second electrodes being commonly connected to said capacitor retaining said control voltage.

7. The phase-locked loop circuit according to claim 1, wherein
said switches included in said first switch group and in said second switch group comprise MOS transistors.

8. The phase-locked loop circuit according to claim 1, further comprising
a phase comparator which comprises a first latch circuit for latching said reference frequency signal at a timing synchronous with said internal clock signal, a second latch circuit for latching the reference frequency signal at a timing synchronous with a second internal clock signal which is said internal clock signal delayed by a first delay time, and a third latch circuit for latching the reference frequency signal at a timing synchronous with a third internal clock signal which is the internal clock signal delayed by a second delay time, wherein
said control circuit comprises both a polarity judgment circuit for judging the polarity of charge on the basis of the outputs of the first, second, and third latch circuits and a capacitance judgment circuit for judging a charging or discharging capacity on the basis of the outputs of the first, second, and third latch circuits.

9. The PLL circuit according to claim 1, further comprising
a control voltage detection circuit for detecting the present control voltage, wherein
said control circuit variably controls, on the basis of both the present control voltage detected by the control voltage detection circuit and said phase difference, the capacitance of said specific capacitor that is made to charge or discharge.

10. The phase-locked loop circuit according to claim 3, wherein
said control circuit comprises both an UP counter for counting the pulse width of an UP signal and a DOWN counter for counting the pulse width of a DOWN signal when the UP signal and DOWN signal, which respectively indicate increasing and decreasing the oscillation frequency of said voltage-controlled oscillator and indicate the difference in frequency between said reference frequency signal and said oscillation frequency signal or internal clock signal, are given, wherein
said polarity judgment circuit judges the polarity of electric charge on the basis of the count values of the UP counter and DOWN counter, and said capacitance judgment circuit judges a capacitance value to be charged or discharged on the basis of the count values of the UP counter and DOWN counter.

11. A semiconductor integrated device including a phase-locked loop circuit, comprising:
a charge/discharge control circuit for outputting a power supply voltage or a ground voltage;
a plurality of capacitors;
a first switch group including plural switches which are respectively connected to the plural capacitors and which supply the plurality of capacitors with the output of the charge/discharge control circuit;
a second switch group including plural switches respectively connected to the plural capacitors; and
a control circuit for controlling the charge/discharge control circuit so that it outputs either a power supply voltage or a ground voltage on the basis of the phase difference between a reference frequency signal and the oscillation frequency signal of a voltage-controlled oscillator or an internal clock signal which is obtained by dividing the oscillation frequency signal, and for controlling the selecting of a specific capacitor from among the plural capacitors by turning on and off the first switch group individually, the charging or discharging of the specific capacitor by using the output of the charge/discharge control circuit, and then the sharing of an electric charge with a capacitor, the electric charge being stored in the specific capacitor by turning on and off the second switch group individually, the capacitor retaining a control voltage that controls the oscillation frequency of the voltage-controlled oscillator, or the sharing of the electric charge of the capacitor retaining the control voltage with the specific capacitor.

12. The semiconductor integrated device according to claim 11, further comprising
a third switch connected between said charge/discharge control circuit and said first switch group, wherein
said control circuit turns on the third switch when the output of said charge/discharge control circuit is supplied to said specific capacitor and turns off the third switch when the electric charge stored in the specific capacitor is shared with said capacitor retaining said control voltage.

13. The semiconductor integrated device according to claim 11, wherein
said control circuit comprises both a polarity judgment circuit for judging a charge polarity on the basis of the phase difference between said reference frequency signal and said oscillation frequency signal or said internal clock signal, and a capacitance judgment circuit for judging a charging capacity or discharging capacity on the basis of the phase difference.

14. The semiconductor integrated device according to claim 11, further comprising
a control voltage detection circuit for detecting the present control voltage, wherein
said control circuit variably controls, on the basis of both the present control voltage detected by the control voltage detection circuit and said phase difference, the capacitance of said specific capacitor that is made to charge or discharge.

15. The semiconductor integrated device according to claim 13, wherein
said control circuit comprises both an UP counter for counting the pulse width of an UP signal and a DOWN counter for counting the pulse width of a DOWN signal when the UP signal and DOWN signal, which respectively indicate increasing and decreasing the oscillation frequency of said voltage-controlled oscillator and indicate the difference in frequency between said reference frequency signal and said oscillation frequency signal or internal clock signal, are given, wherein
said polarity judgment circuit judges the polarity of electric charge on the basis of the count values of the UP counter and DOWN counter, and said capacitance judgment circuit judges a capacitance value to be charged or discharged on the basis of the count values of the UP counter and DOWN counter.

* * * * *